(12) United States Patent
Glasgow

(10) Patent No.: US 11,763,377 B2
(45) Date of Patent: *Sep. 19, 2023

(54) GUIDED PHOTOGRAPHY AND VIDEO ON A MOBILE DEVICE

(71) Applicant: eBay Inc., San Jose, CA (US)

(72) Inventor: Dane Glasgow, Los Altos, CA (US)

(73) Assignee: eBay Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/869,652

(22) Filed: Jul. 20, 2022

(65) Prior Publication Data

US 2022/0405830 A1 Dec. 22, 2022

Related U.S. Application Data

(63) Continuation of application No. 16/988,873, filed on Aug. 10, 2020, now Pat. No. 11,430,053, which is a
(Continued)

(51) Int. Cl.
| | | |
|---|---|---|
| *G06Q 30/06* | (2023.01) | |
| *H04N 13/106* | (2018.01) | |
| *H04N 5/232* | (2006.01) | |
| *H01R 9/24* | (2006.01) | |
| *H01R 33/94* | (2006.01) | |

(Continued)

(52) U.S. Cl.
CPC ..... *G06Q 30/0643* (2013.01); *G06Q 30/0601* (2013.01); *H01R 9/24* (2013.01); *H01R 33/94* (2013.01); *H02B 1/48* (2013.01); *H02J 3/06* (2013.01); *H04N 13/106* (2018.05);
(Continued)

(58) Field of Classification Search
CPC .. G06Q 30/0643; G06Q 30/0601; H01R 9/24; H01R 33/94; H02B 1/48; H02J 3/06; H04N 13/106; H04N 23/64; H04N 23/80; H05K 7/1492
See application file for complete search history.

(56) References Cited

U.S. PATENT DOCUMENTS

| | | |
|---|---|---|
| 6,571,246 B1 | 5/2003 | Anderson et al. |
| 7,911,543 B2 | 3/2011 | Allen et al. |

(Continued)

FOREIGN PATENT DOCUMENTS

| | | |
|---|---|---|
| CN | 1963857 | 5/2007 |
| CN | 101292259 | 10/2008 |

(Continued)

OTHER PUBLICATIONS

"Non-Final Office Action", U.S. Appl. No. 16/988,873, filed Apr. 15, 2022, 13 pages.

(Continued)

*Primary Examiner* — Howard D Brown, Jr.
*Assistant Examiner* — Tyler B Edwards
(74) *Attorney, Agent, or Firm* — FIG. 1 Patents

(57) ABSTRACT

In an example embodiment, an item listing process is run in an item listing application. Upon reaching a specified point in the item listing process, a camera application on the user device is triggered (or the camera directly accessed by the item listing application) to enable a user to capture images using the camera, wherein the triggering includes providing an overlay informing the user as to an angle at which to capture images from the camera.

20 Claims, 12 Drawing Sheets

Related U.S. Application Data continuation of application No. 16/172,345, filed on Oct. 26, 2018, now Pat. No. 10,750,075, which is a continuation of application No. 15/851,563, filed on Dec. 21, 2017, now Pat. No. 10,341,548, which is a continuation of application No. 14/944,414, filed on Nov. 18, 2015, now Pat. No. 9,883,090, which is a continuation of application No. 13/650,372, filed on Oct. 12, 2012, now Pat. No. 9,374,517.

(51) Int. Cl.
| H02B 1/48 | (2006.01) |
| H02J 3/06 | (2006.01) |
| H05K 7/14 | (2006.01) |
| G06Q 30/0601 | (2023.01) |
| H04N 23/60 | (2023.01) |
| H04N 23/80 | (2023.01) |

(52) U.S. Cl.
CPC ............ *H04N 23/64* (2023.01); *H04N 23/80* (2023.01); *H05K 7/1492* (2013.01)

(56) References Cited

U.S. PATENT DOCUMENTS

| | | | |
|---|---|---|---|
| 7,991,646 | B2 | 8/2011 | Lewis et al. |
| 8,954,132 | B2 | 2/2015 | Hubschman et al. |
| 9,374,517 | B2 | 6/2016 | Glasgow |
| 9,552,598 | B2 | 1/2017 | Glasgow |
| 9,883,090 | B2* | 1/2018 | Glasgow ................. H01R 9/24 |
| 10,341,548 | B2 | 7/2019 | Glasgow |
| 10,750,075 | B2 | 8/2020 | Glasgow |
| 11,430,053 | B2* | 8/2022 | Glasgow ............... H04N 23/64 |
| 2003/0177448 | A1 | 9/2003 | Levine et al. |
| 2004/0138898 | A1 | 7/2004 | Elbrader |
| 2004/0189829 | A1 | 9/2004 | Fukuda et al. |
| 2005/0007468 | A1 | 1/2005 | Stavely et al. |
| 2005/0228683 | A1 | 10/2005 | Saylor et al. |
| 2005/0257148 | A1 | 11/2005 | Goodman et al. |
| 2007/0057815 | A1 | 3/2007 | Foy et al. |
| 2007/0061856 | A1 | 3/2007 | Seki et al. |
| 2007/0182823 | A1 | 8/2007 | Maruyama et al. |
| 2008/0180721 | A1 | 7/2008 | Ferlitsch |
| 2008/0189365 | A1 | 8/2008 | Narayanaswami et al. |
| 2009/0106127 | A1 | 4/2009 | Purdy et al. |
| 2009/0108127 | A1 | 4/2009 | Cazals |
| 2009/0158220 | A1 | 6/2009 | Zalewski et al. |
| 2009/0207279 | A1 | 8/2009 | Ochi et al. |
| 2010/0114736 | A1 | 5/2010 | Lewis et al. |
| 2010/0217684 | A1 | 8/2010 | Melcher et al. |
| 2011/0004841 | A1 | 1/2011 | Gildred et al. |
| 2011/0063325 | A1 | 3/2011 | Saunders |
| 2011/0105339 | A1 | 5/2011 | Al Moussalami |
| 2011/0145713 | A1 | 6/2011 | Williams et al. |
| 2011/0201939 | A1 | 8/2011 | Hubschman |
| 2011/0216209 | A1* | 9/2011 | Fredlund ................. G06F 21/83 |
| | | | 348/222.1 |
| 2011/0218209 | A1 | 9/2011 | Yered |
| 2011/0251916 | A1 | 10/2011 | Sipper |
| 2012/0011593 | A1 | 1/2012 | Oka |
| 2012/0062758 | A1 | 3/2012 | Devine et al. |
| 2012/0179609 | A1 | 7/2012 | Agarwal et al. |
| 2012/0259738 | A1 | 10/2012 | Pillai |
| 2012/0310669 | A1 | 12/2012 | Carlberg et al. |
| 2013/0201354 | A1* | 8/2013 | LaScolea ............... H04N 23/64 |
| | | | 348/207.1 |
| 2014/0019303 | A1 | 1/2014 | Argue et al. |
| 2014/0028866 | A1 | 1/2014 | Miyachi et al. |
| 2014/0063344 | A1 | 3/2014 | Dureau |
| 2014/0085334 | A1 | 3/2014 | Payne et al. |
| 2014/0104379 | A1 | 4/2014 | Glasgow |
| 2014/0108482 | A1 | 4/2014 | Glasgow |
| 2014/0108559 | A1 | 4/2014 | Groctwwicz et al. |
| 2016/0073014 | A1 | 3/2016 | Glasgow et al. |
| 2018/0124295 | A1 | 5/2018 | Glasgow |
| 2019/0067917 | A1 | 2/2019 | Glasgow |
| 2020/0374440 | A1 | 11/2020 | Glasgow |

FOREIGN PATENT DOCUMENTS

| | | |
|---|---|---|
| CN | 101690164 | 3/2010 |
| CN | 102025829 | 4/2011 |
| CN | 102376050 | 3/2012 |
| CN | 104169794 | 11/2014 |
| CN | 2861827 | 6/2017 |
| CN | 107256505 | 10/2017 |
| JP | 2004215157 | 7/2004 |
| JP | 2004318563 | 11/2004 |
| JP | 2006074368 | 3/2006 |
| JP | 2007174548 | 7/2007 |
| JP | 2008048331 | 2/2008 |
| JP | 2010157851 | 7/2010 |
| KR | 1020110060297 | 6/2011 |
| KR | 1020110074668 | 7/2011 |
| KR | 1020110136070 | 12/2011 |
| KR | 1020120001285 | 1/2012 |
| KR | 101720767 | 3/2017 |
| WO | WO-2004080340 | 9/2004 |
| WO | WO-2009006949 | 1/2009 |
| WO | WO-2009053863 | 4/2009 |
| WO | WO-2009128783 | 10/2009 |
| WO | WO-2009155688 | 12/2009 |
| WO | WO-2014059018 | 4/2014 |
| WO | WO-2014059307 | 4/2014 |
| WO | WO-2014059307 | 6/2014 |

OTHER PUBLICATIONS 10-2015-7012467, , "Notice of Allowance received for Korean Patent Application No. 10-2015-7012467, dated Apr. 26, 2016", dated Apr. 26, 2016, 3 Pages.

10-2016-7020476, , "Notice of Allowance received for Korean Patent Application No. 10-2016-7020476 dated Dec. 22, 2016", dated Dec. 22, 2016, 2 Pages.

10-2016-7020476, , "Notice of Allowance received for Korean Patent Application No. 10-2016-7020476, dated Dec. 22, 2016", dated Dec. 22, 2016, 7 Pages.

10-2016-7020476, , "Office Action received for Korean Patent Application No. 10-2016-7020476, dated Oct. 19, 2016", dated Oct. 19, 2016, 6 Pages.

10-2017-7007879, , "Notice of Allowance received for Korean Patent Application No. 10-2017-7007879, dated Mar. 21, 2018", dated Mar. 21, 2018, 3 Pages.

10-2017-7007879, , "Notice of Preliminary Rejection received for Korean Application No. 10-2017-7007879 dated Sep. 19, 2017", dated Sep. 19, 2017, 9 Pages.

10-2018-7017503, , "Amendment filed on Oct. 11, 2018, for Korean Patent Application No. 10-2018-7017503", dated Oct. 11, 2018, 16 Pages.

10-2018-7017503, , "Notice Of Allowance received for Korean Patent Application No. 10-2018-7017503, dated Jul. 10, 2019", dated Jul. 10, 2019, 3 Pages.

10-2018-7017503, , "Office Action received for Korean Patent Application No. 10-2018-7017503, dated Dec. 19, 2018", dated Dec. 19, 2018, 10 Pages.

U.S. Appl. No. 13/650,372, , "Applicant Initiated Interview Summary received for U.S. Appl. No. 13/650,372, dated Jun. 25, 2015", dated Jun. 25, 2015, 3 Pages.

U.S. Appl. No. 13/650,372, , "Applicant Initiated Interview Summary received for U.S. Appl. No. 13/650,372, dated Nov. 28, 2014", dated Nov. 28, 2014, 3 Pages.

U.S. Appl. No. 13/650,372, , "Corrected Notice of Allowability received for U.S. Appl. No. 13/650,372, dated May 5, 2016", dated May 5, 2016, 2 Pages.

U.S. Appl. No. 13/650,372, , "Final Office Action received for U.S. Appl. No. 13/650,372, dated Mar. 30, 2015", dated Mar. 30, 2015, 20 Pages.

(56) References Cited

OTHER PUBLICATIONS

U.S. Appl. No. 13/650,372, , "Non-Final Office Action received for U.S. Appl. No. 13/650,372, dated Oct. 23, 2014", dated Oct. 23, 2014, 18 Pages.
U.S. Appl. No. 13/650,372, , "Notice of Allowance received for U.S. Appl. No. 13/650,372, dated Feb. 26, 2016", dated Feb. 26, 2016, 10 Pages.
U.S. Appl. No. 13/650,372, , "Notice of Allowance received for U.S. Appl. No. 13/650,372, dated Jul. 31, 2015", dated Jul. 31, 2015, 9 Pages.
U.S. Appl. No. 13/650,389, , "Examiner Interview Summary received for U.S. Appl. No. 13/650,389, dated Aug. 21, 2015", dated Aug. 21, 2015, 3 Pages.
U.S. Appl. No. 13/650,389, , "Examiner Interview Summary received for U.S. Appl. No. 13/650,389, dated Feb. 10, 2015", dated Feb. 10, 2015, 4 Pages.
U.S. Appl. No. 13/650,389, , "Examiner Interview Summary received for U.S. Appl. No. 13/650,389, dated May 17, 2016", dated May 17, 2016, 3 Pages.
U.S. Appl. No. 13/650,389, , "Final Office Action received for U.S. Appl. No. 13/650,389, dated Jun. 12, 2015", dated Jun. 12, 2015, 18 Pages.
U.S. Appl. No. 13/650,389, , "Non Final Office Action received for U.S. Appl. No. 13/650,389, dated Feb. 12, 2016", dated Feb. 12, 2016, 16 Pages.
U.S. Appl. No. 13/650,389, , "Non-Final Office Action received for U.S. Appl. No. 13/650,389, dated Nov. 5, 2014", dated Nov. 5, 2014, 18 Pages.
U.S. Appl. No. 13/650,389, , "Notice of Allowance Received for U.S. Appl. No. 13/650,389, dated Sep. 14, 2016", dated Sep. 14, 2016, 16 Pages.
13846072.0, , "Communication pursuant to Article 94(3)EPC received for U.S. Patent Application No. 13846072.0, dated Apr. 10, 2018", dated Apr. 10, 2018, 5 Pages.
13846072.0, , "Communication under Rule 71(3) Received for European Patent Application No. 13846072.0, dated Apr. 30, 2019", dated Apr. 30, 2019, 76 Pages.
13846072.0, , "Extended European Search Report received for European Patent Application No. 13846072.0 dated Oct. 15, 2015", dated Oct. 15, 2015, 18 Pages.
13846072.0, , "Partial European Search Report received for European Patent Application No. 13846072.0 dated Jul. 24, 2015", dated Jul. 24, 2015, 7 Pages.
U.S. Appl. No. 14/944,414, , "Corrected Notice of Allowability received for U.S. Appl. No. 14/944,414, dated Dec. 18, 2017", dated Dec. 18, 2017, 2 Pages.
U.S. Appl. No. 14/944,414, , "First Action Interview request filed for U.S. Appl. No. 14/944,414, dated Nov. 18, 2015", dated Nov. 18, 2015, 1 Page.
U.S. Appl. No. 14/944,414, , "Non-Final Office Action received for U.S. Appl. No. 14/944,414, dated Jun. 16, 2017", dated Jun. 16, 2017, 10 Pages.
U.S. Appl. No. 14/944,414, , "Notice of Allowance received for U.S. Appl. No. 14/944,414 dated Sep. 14, 2017", dated Sep. 14, 2017, 9 Pages.
U.S. Appl. No. 15/851,563, , "Corrected Notice of Allowability Received For U.S. Appl. No. 15/851,563, dated Mar. 27, 2019", dated Mar. 27, 2019, 2 Pages.
U.S. Appl. No. 15/851,563, , "Non-Final Office Action Received for U.S. Appl. No. 15/851,563 dated Apr. 26, 2018", dated Apr. 26, 2018, 9 Pages.
U.S. Appl. No. 15/851,563, , "Notice of Allowance received for U.S. Appl. No. 15/851,563, dated Feb. 25, 2019", dated Feb. 25, 2019, 9 Pages.
U.S. Appl. No. 15/851,563, , "Notice of Allowance received for U.S. Appl. No. 15/851,563, dated Nov. 1, 2018", dated Nov. 1, 2018, 9 Pages.
U.S. Appl. No. 15/851,563, , "Preliminary Amendment for U.S. Appl. No. 15/851,563, filed Dec. 30, 2017", dated Dec. 30, 2017, 6 Pages.
U.S. Appl. No. 16/172,345, , "Amendment After Notice of Allowance Under 37 CFR filed on Jun. 30, 2020 U.S. Appl. No. 16/172,345", dated Jun. 30, 2020, 4 Pages.
U.S. Appl. No. 16/172,345, , "Applicant Initiated Interview Summary Received for U.S. Appl. No. 16/172,345, dated Dec. 2, 2019", dated Dec. 2, 2019, 3 Pages.
U.S. Appl. No. 16/172,345, , "Corrected Notice Of Allowability received for U.S. Appl. No. 16/172,345, dated Jul. 23, 2020", dated Jul. 23, 2020, 3 Pages.
U.S. Appl. No. 16/172,345, , "Corrected Notice Of Allowability received for U.S. Appl. No. 16/172,345, dated May 15, 2020", dated May 15, 2020, 2 Pages.
U.S. Appl. No. 16/172,345, , "Final Office Action Received for U.S. Appl. No. 16/172,345, dated Jan. 30, 2020", dated Jan. 30, 2020, 10 Pages.
U.S. Appl. No. 16/172,345, , "Non-Final Office Action received for U.S. Appl. No. 16/172,345, dated Oct. 2, 2019", dated Oct. 2, 2019, 15 Pages.
U.S. Appl. No. 16/172,345, , "Notice Of Allowance received for U.S. Appl. No. 16/172,345, dated Apr. 1, 2020", dated Apr. 1, 2020, 9 Pages.
U.S. Appl. No. 16/988,873, , "Corrected Notice of Allowability", U.S. Appl. No. 16/988,873, dated Jun. 27, 2022, 6 pages.
U.S. Appl. No. 16/988,873, , "Final Office Action received for U.S. Appl. No. 16/988,873, dated Oct. 5, 2021", dated Oct. 5, 2021, 31 Pages.
U.S. Appl. No. 16/988,873, , "Non Final Office Action Received for U.S. Appl. No. 16/988,873, dated Apr. 27, 2021", dated Apr. 27, 2021, 31 Pages.
U.S. Appl. No. 16/988,873, , "Non-Final Office Action Received for U.S. Appl. No. 16/988,873, dated Oct. 5, 2020", dated Oct. 5, 2020, 22 Pages.
U.S. Appl. No. 16/988,873, , "Notice of Allowance", U.S. Appl. No. 16/988,873, dated Jun. 13, 2022, 9 pages.
U.S. Appl. No. 16/988,873, , "Preliminary Amendment Filed on Sep. 30, 2020 for U.S. Appl. No. 16/988,873", dated Sep. 30, 2020, 6 Pages.
19194738.1, , "Communication Pursuant To Article 94(3) EPC received for European Patent Application No. 19194738.1, dated Feb. 16, 2021", dated Feb. 16, 2021, 4 Pages.
19194738.1, , "Communication under Rule 71(3) received for European Patent Application No. 19194738.1, dated Oct. 27, 2021", dated Oct. 27, 2021, 42 Pages.
19194738.1, , "Extended European Search Report Received for European Patent Application No. 19194738.1, dated Oct. 23, 2019", dated Oct. 23, 2019, 9 Pages.
2,861,827, , "Office Action received for Canadian Patent Application No. 2,861,827 dated Nov. 13, 2015", dated Nov. 13, 2015, 8 Pages.
2013328981, , "Fifth Examination Report received for Australian Patent Application No. 2013328981 dated Aug. 4, 2015", dated Aug. 4, 2015, 3 Pages.
2013328981, , "First Examination Report received for Australian Patent Application No. 2013328981 dated Aug. 8, 2014", dated Aug. 8, 2014, 4 Pages.
2013328981, , "Fourth Examination Report received for Australian Patent No. 2013328981 dated Jun. 23, 2015", dated Jun. 23, 2015, 3 Pages.
2013328981, , "Second Examination Report received for Australian Patent Application No. 2013328981 dated Dec. 10, 2014", dated Dec. 10, 2014, 3 Pages.
2013328981, , "Third Examination Report received for Australian Patent Application No. 2013328981 dated Apr. 8, 2015", dated Apr. 8, 2015, 3 Pages.
201380014338.6, , "Office Action received for Chinese Patent Application No. 201380014338.6, dated Aug. 2, 2016", dated Aug. 2, 2016, 15 Pages.
2015261677, , "First Examination Report Received for Australian Patent Application No. 2015261677 dated May 30, 2017", dated May 30, 2017, 3 Pages.
2015261677, , "Subsequent Examination Report received for Australian Patent Application No. 2015261677 dated Sep. 25, 2017", dated Sep. 25, 2017, 2 Pages.

(56) References Cited

OTHER PUBLICATIONS 2015-7012467, , "Office Action received for Korean Patent Application No. 2015-7012467, dated Feb. 15, 2016", dated Feb. 15, 2016, 19 Pages.
201710347096.2, , "Notice of Decision to Grant Received for Chinese Patent Application No. 201710347096.2, dated Jul. 15, 2020", dated Jul. 15, 2020, 4 Pages.
201710347096.2, , "Office Action Received for Chinese Patent Application No. 201710347096.2, dated Feb. 6, 2020", dated Feb. 6, 2020, 9 Pages.
PCT/US2013/064132, , "International Preliminary Report on Patentability received for PCT Application No. PCT/US2013/064132, dated Apr. 23, 2015", dated Apr. 23, 2015, 6 Pages.
PCT/US2013/064132, , "International Search Report received for PCT Patent Application No. PCT/US2013/064132, dated Dec. 24, 2013", dated Dec. 24, 2013, 2 Pages.
PCT/US2013/064132, , "International Written Opinion received for PCT Patent Application No. PCT/US2013/064132, dated Dec. 24, 2013", dated Dec. 24, 2013, 4 Pages.
PCT/US2013/064594, , "International Preliminary Report on Patentability received for PCT Application No. PCT/US2013/064594, dated Apr. 23, 2015", dated Apr. 23, 2015, 8 Pages.
PCT/US2013/064594, , "International Search Report received for PCT Application No. PCT/US2013/064594, dated Apr. 17, 2014", dated Apr. 17, 2014, 2 Pages.
PCT/US2013/064594, , "Written Opinion received for PCT Application No. PCT/US2013/064594, dated Apr. 17, 2014", dated Apr. 17, 2014, 6 Pages.

* cited by examiner

GUIDED PHOTOGRAPHY AND VIDEO ON A MOBILE DEVICE

CROSS-REFERENCE TO RELATED APPLICATIONS

This application is a continuation of and claims the benefit of priority to U.S. patent application Ser. No. 16/988,873, filed on Aug. 10, 2020 which is a continuation of and claims the benefit of priority to U.S. patent application Ser. No. 16/172,345, filed on Oct. 26, 2018, now U.S. Pat. No. 10,750,075, and which application is a continuation of and claims the benefit of priority to U.S. patent application Ser. No. 15/851,563, filed on Dec. 21, 2017, now U.S. Pat. No. 10,341,548, and which application is a continuation of and claims the benefit of priority to U.S. patent application Ser. No. 14/944,414, filed on Nov. 18, 2015, now U.S. Pat. No. 9,883,090, and which application is a continuation of and claims the benefit of priority to U.S. patent application Ser. No. 13/650,372, filed on Oct. 12, 2012, now U.S. Pat. No. 9,374,517, each of which are hereby incorporated by reference herein in their entireties.

TECHNICAL FIELD

This application relates to the technical fields of web pages and mobile devices and, in one example embodiment, a system and method to trigger web workflow from a mobile device and vice-versa.

BACKGROUND

With the dawn of mobile devices, and specifically cameras embedded in the mobile devices, users are utilizing their mobile phones to aid in activities that were traditionally the domain of desktop or laptop computers. For example, users are using their mobile devices to enter and post item listing information for online sales, such as online auctions. The cameras on these mobile devices can come in handy when photographing the item or items to be sold, and the ability to have the camera integrated with the same device where the user is entering information (through, for example, a stand-alone application installed on the mobile device), makes the experience more seamless for users. The line between retailers and individual sellers has been blurred as more and more users have the ability to quickly and efficiently list items for sale. There are certain items, cars for example, where retailers are often able to get more money or better sales results. Part of this is because retailers of these items have standardized, and effective, means to photograph the items. With the case of cars, auto dealers often take multiple pictures from preset angles and preset car orientations (doors opened or closed, for example) to achieve the best results. Indeed, the consistency between the photographs of one vehicle and photographs of another vehicle can itself lend a sense of credibility to the seller which can translate to higher sales. Individual sellers, however, often photograph these items in wildly variable (and often ineffective) ways.

BRIEF DESCRIPTION OF DRAWINGS

Embodiments of the present invention are illustrated by way of example and not limitation in the figures of the accompanying drawings, in which like reference numbers indicate similar elements and in which.

DETAILED DESCRIPTION

Reference will now be made in detail to specific embodiments including the best modes contemplated by the inventors for carrying out the invention. Examples of these specific embodiments are illustrated in the accompanying drawings. It will be understood that it is not intended to limit the scope of the claims to the described embodiments. On the contrary, it is intended to cover alternatives, modifications, and equivalents as may be included within the spirit and scope of the disclosure as defined by the appended claims. In the following description, specific details are set forth in order to provide a thorough understanding of the subject matter. Embodiments may be practiced without some or all of these specific details. In addition, well known features may not have been described in detail to avoid unnecessarily obscuring the subject matter.

Figure 1:
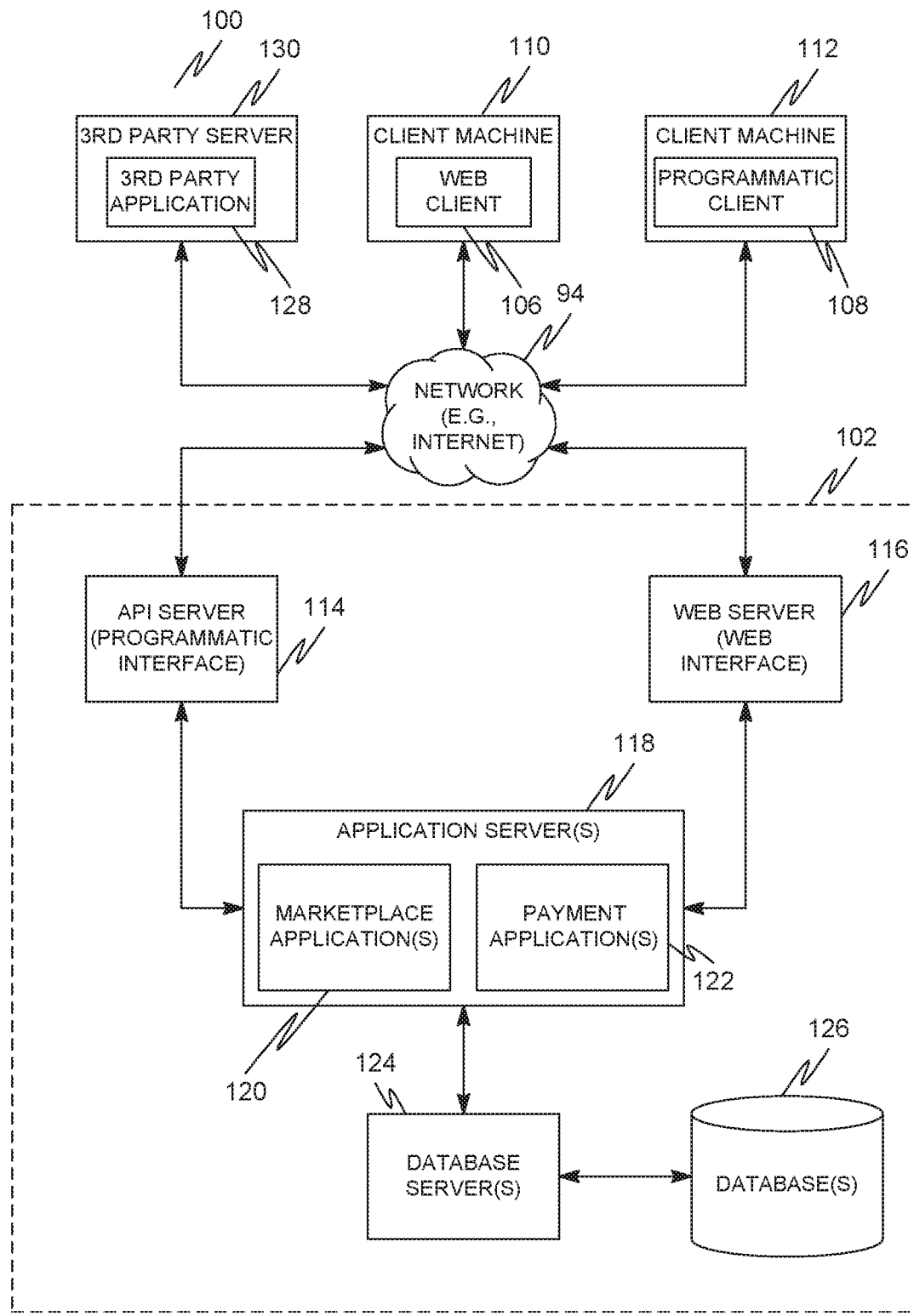
FIG. 1 is a network diagram depicting a client-server system 100, within which one example embodiment may be deployed.

In accordance with the present invention, the components, process steps, and/or data structures may be implemented using various types of operating systems, programming languages, computing platforms, computer programs, and/or general purpose machines. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the concepts disclosed herein. Embodiments may also be tangibly embodied as a set of computer instructions stored on a computer readable medium, such as a memory device. In an example embodiment, a user of a mobile device is guided through the process of taking photographs of an item using a specified template. The result of using this template is that photographs are taken at pre-specified angles and a requisite number of photographs are taken to effectively list an item for sale. In another example embodiment, the number and angles of the photographs are sufficient to generate a three dimensional model of the item. FIG. 1 is a network diagram depicting a client-server system 100, within which one example embodiment may be deployed. A networked system 102, in the example forms of a network-based marketplace or publication system, provides server-side functionality, via a network 104 (e.g., the Internet or Wide Area Network (WAN)) to one or more clients. FIG. 1 illustrates, for example, a web client 106 (e.g., a browser, such as the Internet Explorer browser developed by Microsoft Corporation of Redmond, Wash. State), and a programmatic client 108 executing on respective client machines 110 and 112.

An Application Program Interface (API) server 114 and a web server 116 are coupled to, and provide programmatic and web interfaces respectively to, one or more application servers 118. The application servers 118 host one or more marketplace applications 120 and payment applications 122. The application servers 118 are, in turn, shown to be coupled to one or more databases servers 124 that facilitate access to one or more databases 126.

The marketplace applications 120 may provide a number of marketplace functions and services to users that access the networked system 102. The payment applications 122 may likewise provide a number of payment services and functions to users. The payment applications 122 may allow users to accumulate value (e.g., in a commercial currency, such as the U.S. dollar, or a proprietary currency, such as "points") in accounts, and then later to redeem the accumulated value for products (e.g., goods or services) that are made available via the marketplace applications 120. While the marketplace and payment applications 120 and 122 are shown in FIG. 1 to both form part of the networked system 102, it will be appreciated that, in alternative embodiments, the payment applications 122 may form part of a payment service that is separate and distinct from the networked system 102.

Further, while the client-server system 100 shown in FIG. 1 employs a client-server architecture, the present invention is of course not limited to such an architecture, and could equally well find application in a distributed, or peer-to-peer, architecture system, for example. The various marketplace and payment applications 120 and 122 could also be implemented as standalone software programs, which do not necessarily have networking capabilities.

The web client 106 accesses the various marketplace and payment applications 120 and 122 via the web interface supported by the web server 116. Similarly, the programmatic client 108 accesses the various services and functions provided by the marketplace and payment applications 120 and 122 via the programmatic interface provided by the API server 114. The programmatic client 108 may, for example, be a seller application (e.g., the TurboLister application developed by eBay Inc., of San Jose, Calif.) to enable sellers to author and manage listings on the networked system 102 in an off-line manner, and to perform batch-mode communications between the programmatic client 108 and the networked system 102.

FIG. 1 also illustrates a third party application 128, executing on a third party server machine 130, as having programmatic access to the networked system 102 via the programmatic interface provided by the API server 114. For example, the third party application 128 may, utilizing information retrieved from the networked system 102, support one or more features or functions on a website hosted by the third party. The third party website may, for example, provide one or more promotional, marketplace or payment functions that are supported by the relevant applications of the networked system 102.

Figure 2:
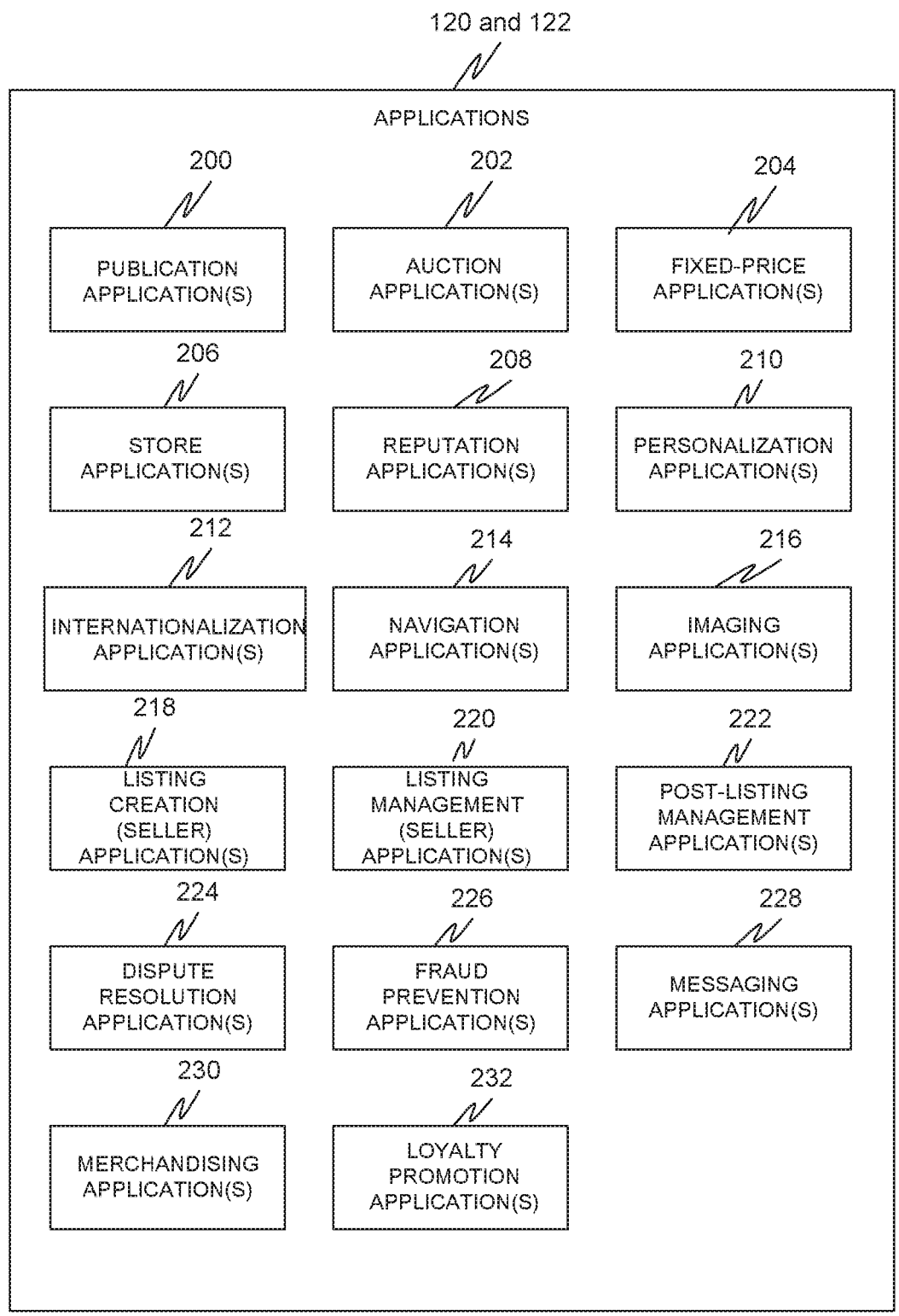
FIG. 2 is a block diagram illustrating multiple applications 120 and 122 that, in one example embodiment, are provided as part of the networked system 102, shown in FIG. 1.

FIG. 2 is a block diagram illustrating multiple applications 120 and 122 that, in one example embodiment, are provided as part of the networked system 102, shown in FIG. 1. The applications 120 and 122 may be hosted on dedicated or shared server machines (not shown) that are communicatively coupled to enable communications between server machines. The applications themselves are communicatively coupled (e.g., via appropriate interfaces) to each other and to various data sources, so as to allow information to be passed between the applications or so as to allow the applications to share and access common data. The applications may furthermore access server one or more databases 126 via the database servers 124, both shown in FIG. 1.

The networked system 102 may provide a number of publishing, listing and price-setting mechanisms whereby a seller may list (or publish information concerning) goods or services for sale, a buyer can express interest in or indicate a desire to purchase such goods or services, and a price can be set for a transaction pertaining to the goods or services. To this end, the marketplace applications 120 are shown to include at least one publication application 200 and one or more auction applications 202 which support auction-format listing and price setting mechanisms (e.g., English, Dutch, Vickrey, Chinese, Double, Reverse auctions etc.). The various auction applications 202 may also provide a number of features in support of such auction-format listings, such as a reserve price feature whereby a seller may specify a reserve price in connection with a listing and a proxy-bidding feature whereby a bidder may invoke automated proxy bidding.

A number of fixed-price applications 204 support fixed-price listing formats (e.g., the traditional classified advertisement-type listing or a catalogue listing) and buyout-type listings. Specifically, buyout-type listings (e.g., including the Buy-It-Now (BIN) technology developed by eBay Inc., of San Jose, Calif.) may be offered in conjunction with auction-format listings, and allow a buyer to purchase goods or services, which are also being offered for sale via an auction, for a fixed-price that is typically higher than the starting price of the auction.

Store applications 206 allow a seller to group listings within a "virtual" store, which may be branded and otherwise personalized by and for the seller. Such a virtual store may also offer promotions, incentives and features that are specific and personalized to a relevant seller.

Reputation applications 208 allow users that transact, utilizing the networked system 102, to establish, build and maintain reputations, which may be made available and published to potential trading partners. Consider that where, for example, the networked system 202 supports person-to-person trading, users may otherwise have no history or other reference information whereby the trustworthiness and credibility of potential trading partners may be assessed. The reputation applications 208 allow a user, for example through feedback provided by other transaction partners, to establish a reputation within the networked system 102 over time. Other potential trading partners may then reference such a reputation for the purposes of assessing credibility and trustworthiness.

Personalization applications 210 allow users of the networked system 102 to personalize various aspects of their interactions with the networked system 102. For example a user may, utilizing an appropriate personalization application 210, create a personalized reference page at which information regarding transactions to which the user is (or has been) a party may be viewed. Further, a personalization application 210 may enable a user to personalize listings and other aspects of their interactions with the networked system 102 and other parties.

The networked system 102 may support a number of marketplaces that are customized, for example, for specific geographic regions. A version of the networked system 102 may be customized for the United Kingdom, whereas another version of the networked system 102 may be customized for the United States. Each of these versions may operate as an independent marketplace, or may be customized (or internationalized) presentations of a common underlying marketplace. The networked system 102 may accordingly include a number of internationalization applications 212 that customize information (and/or the presentation of information) by the networked system 102 according to predetermined criteria (e.g., geographic, demographic or marketplace criteria). For example, the internationalization applications 212 may be used to support the customization of information for a number of regional websites that are operated by the networked system 102 and that are accessible via respective web servers 216.

Navigation of the networked system 102 may be facilitated by one or more navigation applications 214. For example, a search application (as an example of a navigation application) may enable key word searches of listings published via the networked system 102. A browse application may allow users to browse various category, catalogue, or inventory data structures according to which listings may be classified within the networked system 102. Various other navigation applications may be provided to supplement the search and browsing applications.

In order to make listings, available via the networked system 102, as visually informing and attractive as possible, the marketplace applications 120 may include one or more imaging applications 216 utilizing which users may upload images for inclusion within listings. An imaging application 216 also operates to incorporate images within viewed listings. The imaging applications 216 may also support one or more promotional features, such as image galleries that are presented to potential buyers. For example, sellers may pay an additional fee to have an image included within a gallery of images for promoted items.

Listing creation applications 218 allow sellers conveniently to author listings pertaining to goods or services that they wish to transact via the networked system 102, and listing management applications 120 allow sellers to manage such listings. Specifically, where a particular seller has authored and/or published a large number of listings, the management of such listings may present a challenge. The listing management applications 220 provide a number of features (e.g., auto-relisting, inventory level monitors, etc.) to assist the seller in managing such listings. One or more post-listing management applications 222 also assist sellers with a number of activities that typically occur post-listing.

For example, upon completion of an auction facilitated by one or more auction applications 102, a seller may wish to leave feedback regarding a particular buyer. To this end, a post-listing management application 222 may provide an interface to one or more reputation applications 208, so as to allow the seller conveniently to provide feedback regarding multiple buyers to the reputation applications 208.

Dispute resolution applications 224 provide mechanisms whereby disputes arising between transacting parties may be resolved. For example, the dispute resolution applications 224 may provide guided procedures whereby the parties are guided through a number of steps in an attempt to settle a dispute. In the event that the dispute cannot be settled via the guided procedures, the dispute may be escalated to a third party mediator or arbitrator.

A number of fraud prevention applications 226 implement fraud detection and prevention mechanisms to reduce the occurrence of fraud within the networked system 102.

Messaging applications 228 are responsible for the generation and delivery of messages to users of the networked system 102, such messages for example advising users regarding the status of listings at the networked system 102 (e.g., providing "outbid" notices to bidders during an auction process or to provide promotional and merchandising information to users). Respective messaging applications 228 may utilize any one have a number of message delivery networks and platforms to deliver messages to users. For example, messaging applications 228 may deliver electronic mail (e-mail), instant message (IM), Short Message Service (SMS), text, facsimile, or voice (e.g., Voice over IP (VoIP)) messages via the wired (e.g., the Internet), Plain Old Telephone Service (POTS), or wireless (e.g., mobile, cellular, WiFi, WiMAX) networks.

Merchandising applications 230 support various merchandising functions that are made available to sellers to enable sellers to increase sales via the networked system 102. The merchandising applications 230 also operate the various merchandising features that may be invoked by sellers, and may monitor and track the success of merchandising strategies employed by sellers.

The networked system 102 itself, or one or more parties that transact via the networked system 102, may operate loyalty programs that are supported by one or more loyalty/promotions applications 232. For example, a buyer may earn loyalty or promotions points for each transaction established and/or concluded with a particular seller, and be offered a reward for which accumulated loyalty points can be redeemed.

As described earlier, in an example embodiment, user actions undertaken in a main process on one device may spawn a workflow on another device. For example, the user may be undertaking an item listing process (main process) on one device. When this listing process reaches a certain point, it may spawn a subprocess run on another device accessible to the user. In one example, the n item listing process on a desktop computer may reach a point where the user is prompted to upload a photograph of the item to be listed. This may spawn a photo-taking subprocess on the user's mobile device (e.g., smartphone). This photo-taking subprocess may then run the user through the steps of taking a photograph (or selecting a photograph from ones already stored on the mobile device). In some embodiments, the subprocess may then undertake on its own to pass output directly to a server (e.g., upload the photo directly to the item listing server). In other embodiments, the subprocess may pass the output to the main process. Embodiments are also foreseen where the device running the subprocess can then pass the output of the subprocess, as well as control of the process, back to the original device (e.g., send the photo back to the main listing process, which itself will upload the photo).

Figure 3:
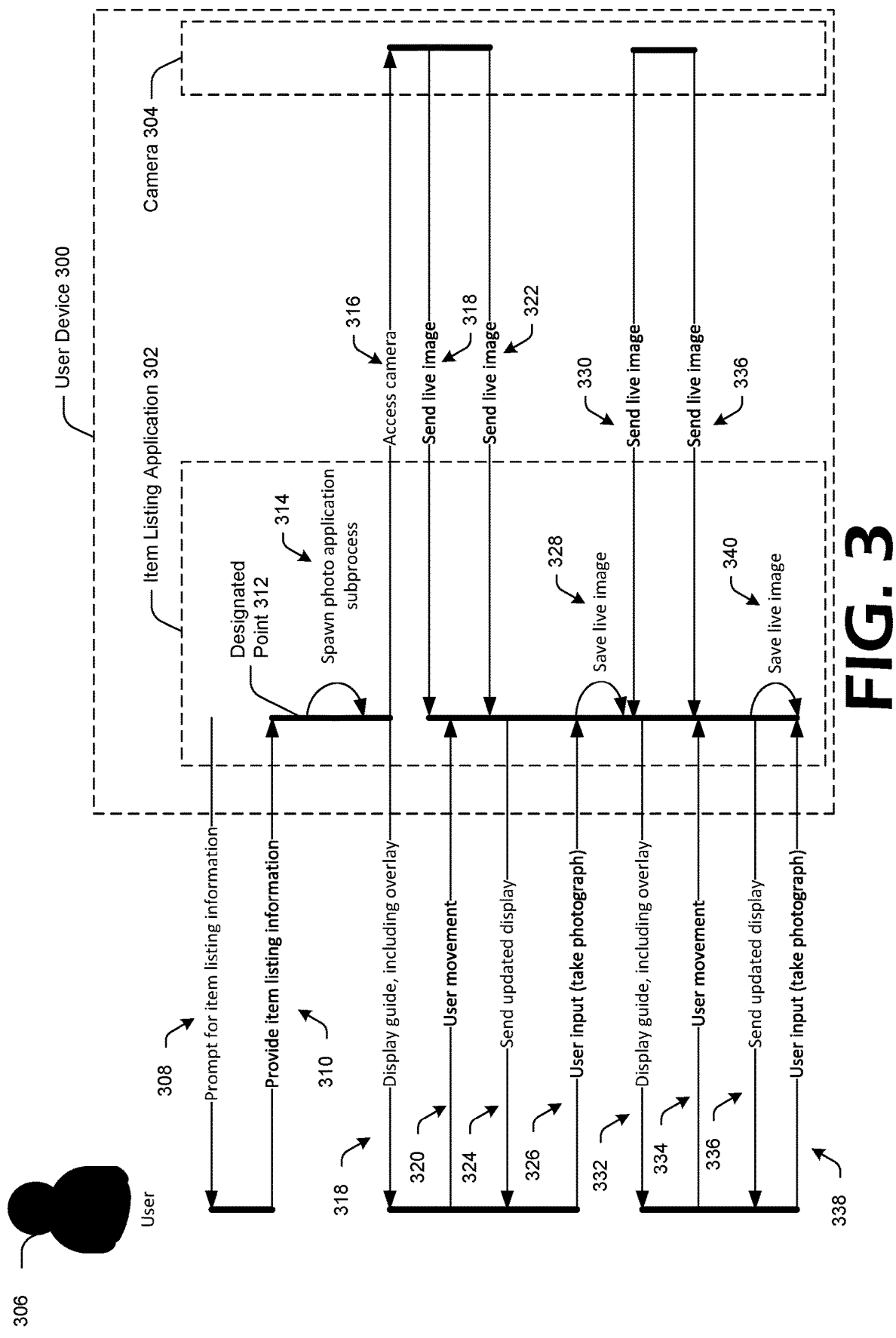
FIG. 3 is a diagram illustrating a method for guided photography on a user device in accordance with an example embodiment.

FIG. 3 is a diagram illustrating a method for guided photography on a user device in accordance with an example embodiment. As can be seen, a user device 300 may comprise an item listing application 302 and a camera 304. It should be noted that in this example embodiment, an API may be utilized to permit the item listing application 302 to directly access the camera 304. As such, the user may see a camera sub-application as part of the item listing application 302, and the camera sub-application simply contacts the camera 304 to perform hardware tasks, such as the capturing of a photograph by the camera. The user device 300 may, in an example embodiment, be a mobile device, such as a cellular phone with an operating system capable of running applications, or "apps." Also shown in the system is user 306. Of course, the user is not an electronic or software component, and thus is merely depicted in order to further the understanding of the subject matter of this disclosure.

At 308, the item listing application 302 may prompt the user 306 for item listing information. This may include non-photograph related information, such as item title, description, starting prices, etc. At 310, the user 306 provides the item listing information to the application 302. It should be noted that while this item listing information is depicted as being requested in a single step and provided in a single step, in reality this may involve a back-and-forth between the item listing application 302 and the user 306 with the user providing more information each time. Additionally, while this information is depicted as being provided prior to any photographs of the item being provided, in reality some or all of the information could be requested and provided after what are depicted here as "later" steps.

At 312, the item listing application 302 may reach a designated point in the listing process. At this point, a camera application subprocess may be spawned at 314. This camera application subprocess will guide the user through the steps of taking photographs appropriate for the genre of the item. Because the application 302 may be provided in a way that it will be capable of being used to list a wide variety of applications, there may be a plurality of different camera application subprocesses, and the item listing application 302 decides which camera application subprocess to spawn based on a category of the item. This category may have been communicated in the first listing information provided at 308.

At 316, the item listing application 302, via the camera application subprocess, accesses the camera 304. At the same time, the application displayed a guide as to how the user should take a photograph at 318. This may include, for example, providing an overlay on top of a viewfinder within the camera application subprocess. The overlay may contain a wireframe rendering of a generic item within the relevant category. For example, if the category is automobiles, then a generic car wireframe may be overlayed on top of the image seen by the user 306 This may also involve presenting instructions, for example verbal instructions, to the user as to how to take the photograph, which may include telling the user to alight the item with the wireframe, how to ensure proper lighting, and how to ensure proper sharpness, for example. At 318, a live image may be transmitted from the camera 304 to item listing application 302. It should be noted that in some example embodiments, the camera 304 continuously outputs a live image to item listing application 302, after item listing application 302 accesses the camera. The image may be a representation of what the camera 304 is capturing at that particular point in time. As the user 306 moves the user device 300, the image changes. This movement is depicted at 320, and another live image is depicted as being sent at 322. Presumably the live image 322 will be an updated live image in light of the user movement. Also presumably, the user movement is an attempt by the user to align the live image with the overlayed wireframe. Once the user is satisfied that the angle of the photograph is aligned with the overlayed wireframe, the user may provide user input indicting that a photograph should be taken. This may include, for example, depressing a virtual or actual button on the user device. This is depicted as 326. At 328, the image captured by the camera 304 at the time the user input 326 was received is saved as a first photograph of the item. This process then repeats using another guide as to how to take a photograph, such as an overlay showing the generic wireframe at a different angle. The repeating process is depicted at 3320-340. This process can repeat any number of times until the requisite number of photographs has been taken, as dictated by the category.

Figure 4:
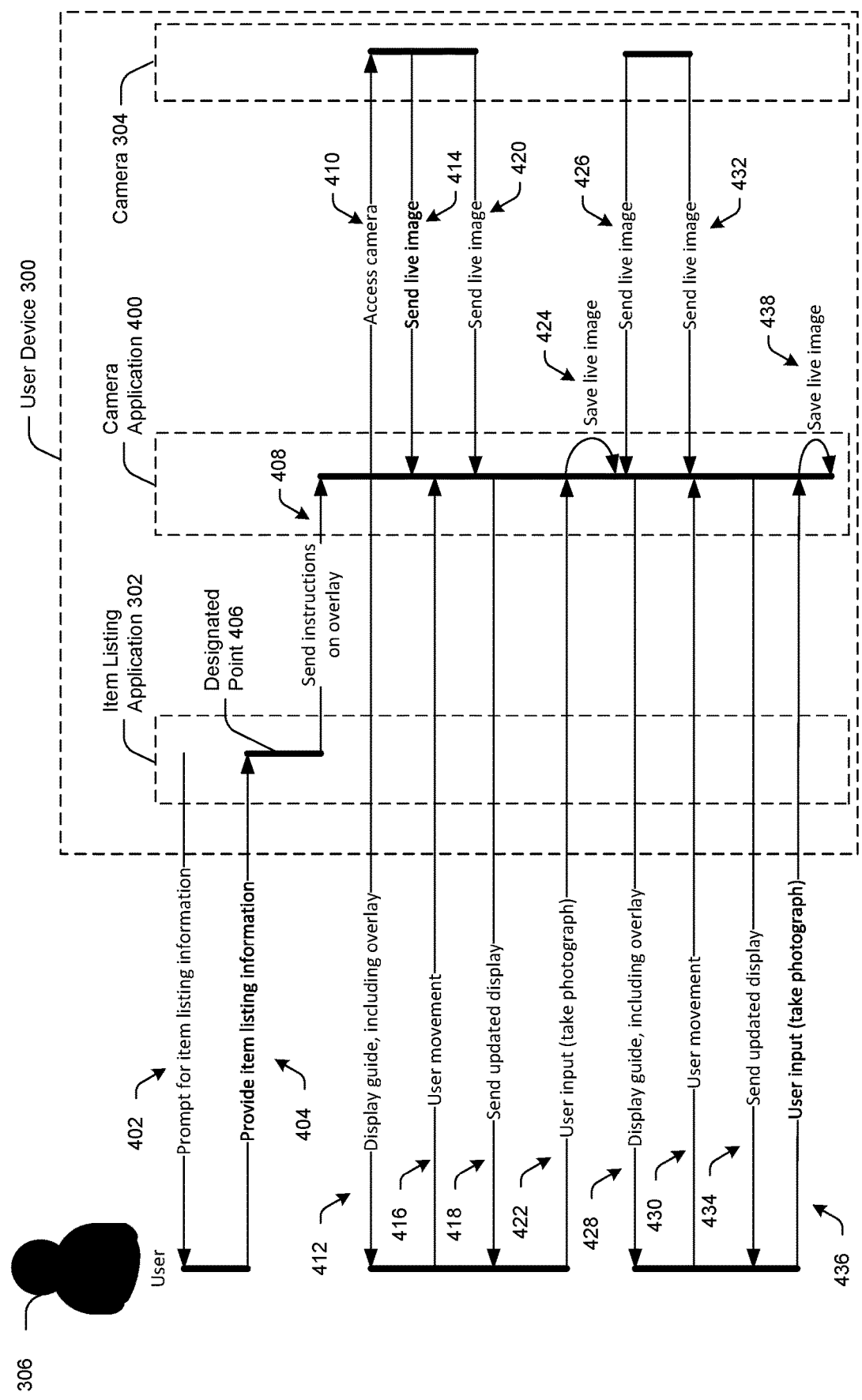
FIG. 4 is a diagram illustrating a method for guided photography on a user device in accordance with another example embodiment.

FIG. 4 is a diagram illustrating a method for guided photography on a user device in accordance with another example embodiment. This diagram is similar to that of FIG. 3, except that rather an API being used to allow a camera application subprocess of application 302 to take the photograph direct, a separate camera application 400 on user device 300 is used for that purpose. At 402, the application 302 may prompt the user 306 for item listing information. This may include non-photograph related information, such as item title, description, starting prices, etc. At 404, the user 306 provides the item listing information to the application 302. As described above, while this item listing information is depicted as being requested in a single step and provided in a single step, in reality this may involve a back-and-forth between the application 302 and the user 306 with the user providing more information each time. Additionally, while this information is depicted as being provided prior to any photographs of the item being provided, in reality some or all of the information could be requested and provided after what are depicted here as "later" steps.

At 406, the application 302 may reach a designated point in the listing process. At this point, instructions may be sent to the camera application 400 at 408. These instructions may include instructions on overlays to be presented from within the camera application 400. This camera application 400 will guide the user through the steps of taking photographs appropriate for the genre of the item. Because the application 302 may be provided in a way that it will be capable of being used to list a wide variety of applications, there may be a plurality of different types of instructions to be sent to the camera application 400, and the application 302 decides which information to send based on a category of the item. This category may have been communicated in the first listing information provided at 404.

At 410, the camera application 400 accesses the camera 304. At the same time, the camera application 400 displays a guide as to how the user should take a photograph at 412. This may include, for example, providing an overlay on top of a viewfinder within the camera application subprocess. The overlay may contain a wireframe rendering of a generic item within the relevant category. At 414, a live image may be transmitted from the camera 304 to camera application 400. It should be noted that in some example embodiments, the camera 304 continuously outputs a live image to camera application 400, after camera application 400 accesses the camera. The image may be a representation of what the camera 304 is capturing at that particular point in time. As the user 306 moves the user device 300, the image changes. This movement is depicted at 416, and another live image is depicted as being sent at 420. Presumably the live image 420 will be an updated live image in light of the user movement. Also presumably, the user movement is an attempt by the user to align the live image with the overlayed wireframe. Once the user is satisfied that the angle of the photograph is aligned with the overlayed wireframe, the user may provide user input indicting that a photograph should be taken. This may include, for example, depressing a virtual or actual button on the user device. This is depicted as 422. At 424, the image captured by the camera 304 at the time the user input 424 was received is saved as a first photograph of the item. This process then repeats using another guide as to how to take a photograph, such as an overlay showing the generic wireframe at a different angle. The repeating process is depicted at 426-438. This process can repeat any number of times until the requisite number of photographs has been taken, as dictated by the category.

In both FIGS. 3 and 4, the application 302 may periodically (or all in one batch) send the listing information as well as the photograph(s) to an item listing server (not pictured). This allows the listing information and the photograph(s) to be used in an online auction or other listing. Additionally, in some example embodiments, the server may render a three dimensional image of the item based upon the photographs. This will be described in more detail later.

It should be noted that it not necessary for the application 302 and the camera application 400 to be located on the same physical device. While FIGS. 3 and 4 each depict both being contained on a single user device 300, in another example embodiment, they are located on different devices. The camera application 400 may be located on, for example, a mobile device having the camera 304, whereas the application 302 may be contained on another device, such as a desktop or laptop computer, or another mobile device. As such, the spawning of the camera application along with the transmitting of the overlay may actually result in a process occurring on a different device than the device on which the user began the listing process. In essence, it becomes feasible for the user to utilize multiple user devices to enter listing information for a single item.

Figure 5:
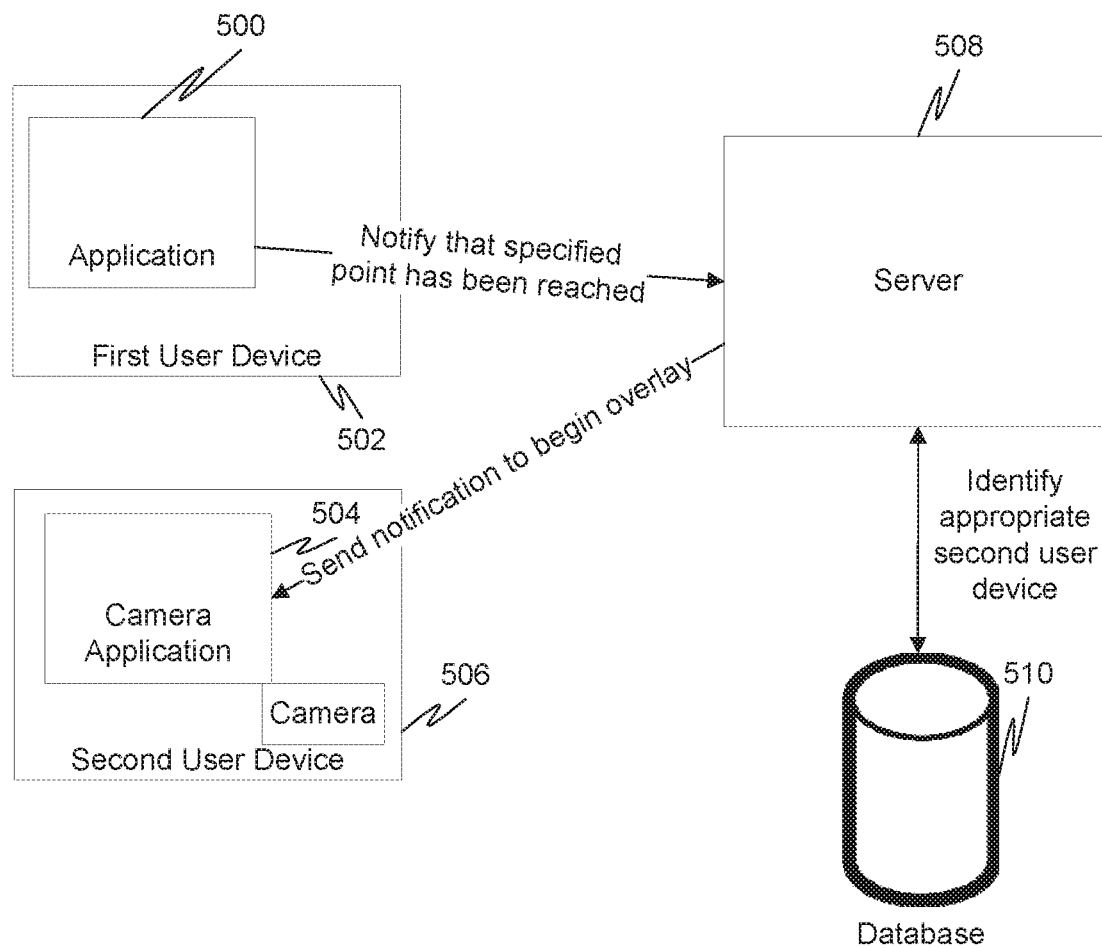
FIG. 5 is a block diagram illustrating a system in accordance with an example embodiment.

In a multiple-device embodiment, when the application 302 reaches the point at which a secondary process (such as a camera application 400) needs to be spawned on another device, it may be necessary for a determination to be made about which other device to spawn this secondary process, as well as how the secondary process should be presented. There are many different configurations allowing for such determinations, some of which will be presented herein. FIG. 5 is a block diagram illustrating a system in accordance with an example embodiment. Here, the application 500 runs on a first user device 502. A camera application 504 then operates on a second user device 506. Upon reaching a point in the main process at which the camera application 504 should be spawned, the application 500 then notifies a server 508 that this point has been reached. The server 508 then identifies an appropriate user device on which to spawn the camera application. This may involve, for example, looking up stored device information specific to the user in a user account stored on a database 510. For example, the server 508 may maintain an account for the user. The user may have previously registered the second user device 506 with the server 508 under this account, and identified it as an appropriate device on which to spawn the camera application 504. Thus, upon receiving a notification from the first user device 502 that the point in the main process has been reached, the server may then send a notification to the camera application 504 on the second user device 506. Alternatively, the server 508 can send the information about the second user device 506 to the first user device 502, allowing the first user device 502 to directly contact the second user device 506.

Figure 6:
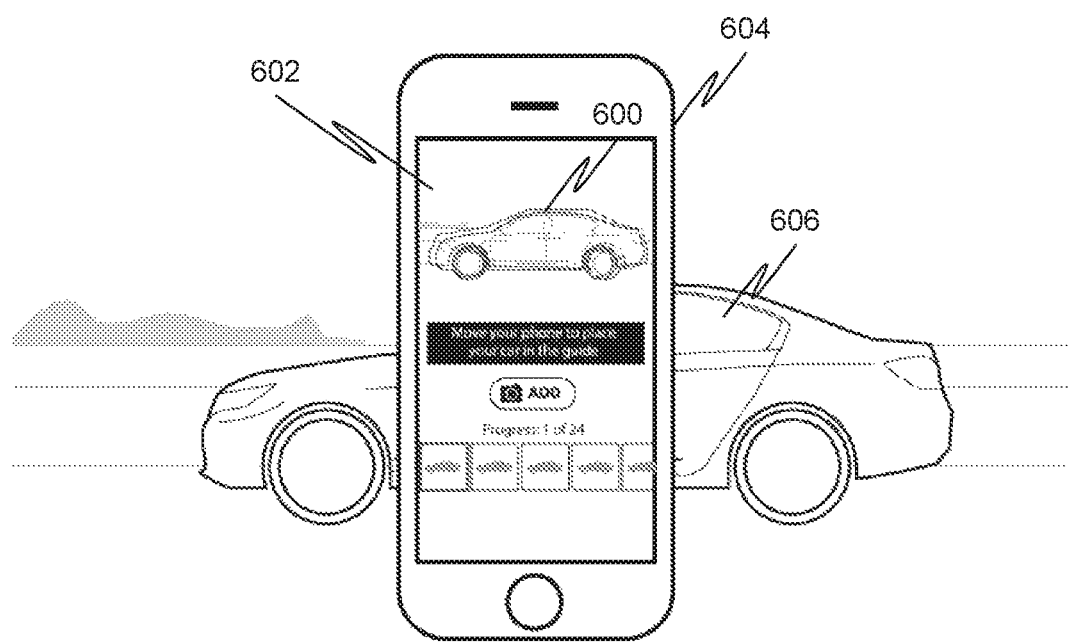
FIG. 6 is a diagram illustrating a screen image of an item listing application suitable for implementing the above-described methods in accordance with an example embodiment.

FIG. 6 is a diagram illustrating a screen image of an item listing application suitable for implementing the above-described methods in accordance with an example embodiment. In this embodiment, a wireframe model 600 is displayed over a live camera image 602. The user may then use this model 600 to position the user device 604 properly so that the vehicle 606 is displayed in the middle of the wireframe. Instructions 608 may be provided to aid in this process.

Figure 7:
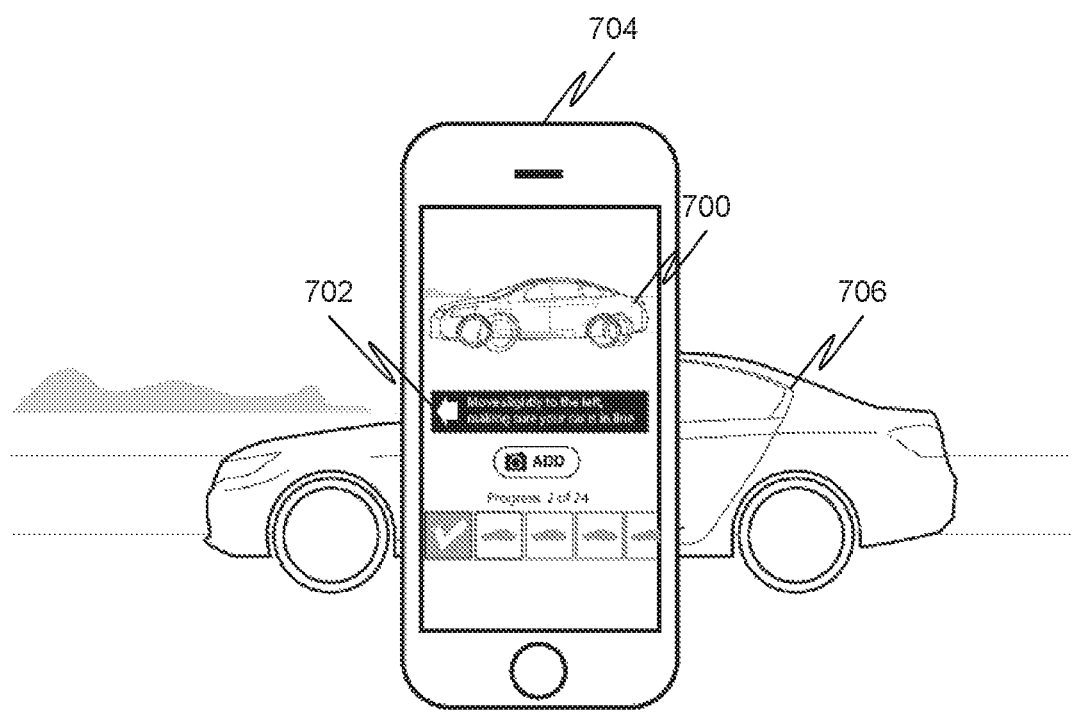
FIG. 7 is a diagram illustrating a screen image of an item listing application suitable for implementing the above-described methods in accordance with another example embodiment.

In addition to wireframe, the system may be designed to perform image processing and/or recognition and determine that the image is not positioned properly for the desired shot. The system may then provide guidance as to the direction the user should move or rotate the user device in order to correct the shot. FIG. 7 is a diagram illustrating a screen image of an item listing application suitable for implementing the above-described methods in accordance with another example embodiment. In this embodiment, the wireframe model 700 is supplemented with image processing, resulting in precise instructions 702 to the user as to how to move the user device 704. Here, the system has determined that the vehicle 706 is to the left of the desired shot, and thus the user is instructed to move the user device 704 to the left.

In some example embodiments, this image processing may be performed on the user device, but in other example embodiments a server may be utilized to perform the image processing.

In some example embodiments, the image processing may be extended to determine the category of the item to be listed. For example, the user may simply take a picture of a car, and the image processing may then be used to determine that the item is a car, and then the system can retrieve the appropriate guides and instructions to present to the user to aid in taking additional photographs/videos (e.g., the "car" wireframe may be retrieved and overlaid over the live image from the camera, and a "script" appropriate for taking pictures of cars may be retrieved and executed).

Figure 8:
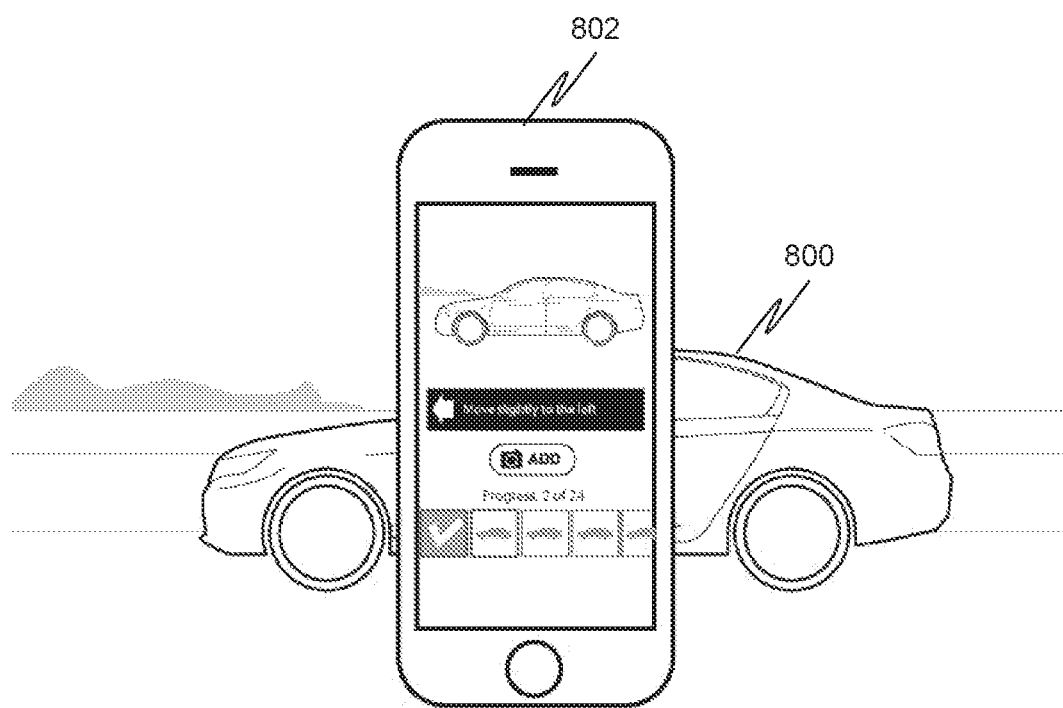
FIG. 8 is a diagram illustrating a screen image of an item listing application suitable for implementing the above-described methods in accordance with another example embodiment.

FIG. 8 is a diagram illustrating a screen image of an item listing application suitable for implementing the above-described methods in accordance with another example embodiment. Here, image processing is performed to determine the position of the image. In contrast to FIG. 7, however, in this embodiment there is no wireframe model. The system simply performs the image processing and provides instructions 800 as to how the user should move the user device 802.

Figure 9:
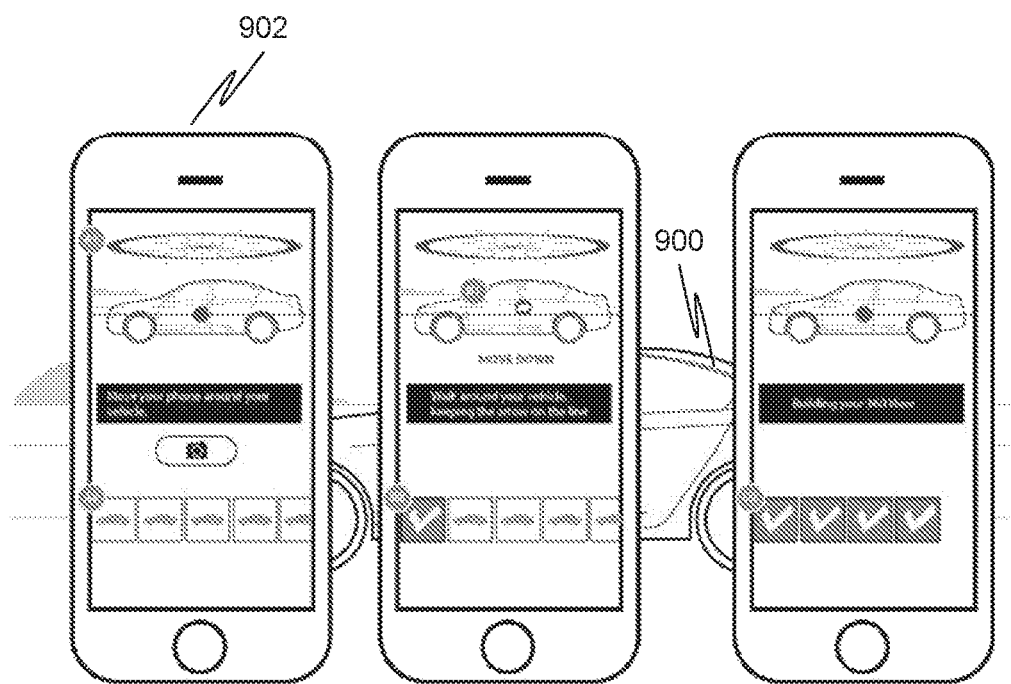
FIG. 9 is a diagram illustrating a screen image of an item listing application suitable for implementing the above-described methods in accordance with another example embodiment.

FIG. 9 is a diagram illustrating a screen image of an item listing application suitable for implementing the above-described methods in accordance with another example embodiment. In this embodiment, the user is simply instructed to take a video of the vehicle 900 by walking all the way around the vehicle. As the user walks, the system analyzes the video and extracts appropriately angled shots to match some preset criteria for the item. Thus, this embodiment depicts real-time video processing and extracted of still images from the video. Of course, this video processing could also be performed after the user has completely circled the vehicle 900, by the user device 902 or by a separate server.

Referring first to FIG. 6A, a wireframe model 600 may be overlayed over a live image 602 from a camera. While the general angle of the vehicle in the live image is similar to that of the wireframe model, the vehicle is actually at a 180 degree angle from wireframe model. As such, in between FIG. 6A and FIG. 6B, the user moves the mobile device to the opposite location around the car. Therefore, in FIG. 6B, the vehicle is roughly in the correct orientation and the user is able to take the picture. Once the picture is taken, it is saved and the camera application (or item listing application) can advance to the next wireframe, depicted as 604 in FIG. 6C. Here, the same live image as was taken in FIG. 6B is still present, but a new wireframe 604 is overlayed, showing the user the orientation of the next photo to take. As such, the user may move the mobile device to yet another orientation, resulting in the live image displayed in FIG. 6D, which roughly corresponds to the orientation of the wireframe. The user may then take this second photograph. The process may continue until all the specified photos for the item category have been taken.

It should be noted that while the aforementioned describes a process for taking individual photographs, in some example embodiments the same concept can be extended to taking videos. Specifically, a user can be provided with an overlay that guides the user as to the angles to take with the video. Rather than waiting for user input indicating that a particular angle's shot has been completed, as with a photo, in the video embodiment the system can detect that the user has achieved the desired angle and then automatically prompt the user for the next angle, altering the overlay in real time.

In another example embodiment, the photographs and/or videos taken using this process can be checked by either the application, the camera application, or the server to determine if desired criteria are met. For example, the system could examine a photograph to determine whether the desired angle was achieved, whether a minimum lighting standard has been achieved, whether appropriate sharpness (i.e., not blurry) has been achieved, and so on. Similar examination can be made of a video. If the photo or video does not meet the desired criteria, the user can be prompted to retake that particular photo or video. This checking can either be performed in real time, e.g., as soon as the user takes a photo it can be checked and the user prompted to retake if necessary before the user is allowed to progress to the next angle, or it can be checked after the entire photo or video taking process is complete.

Figure 10:
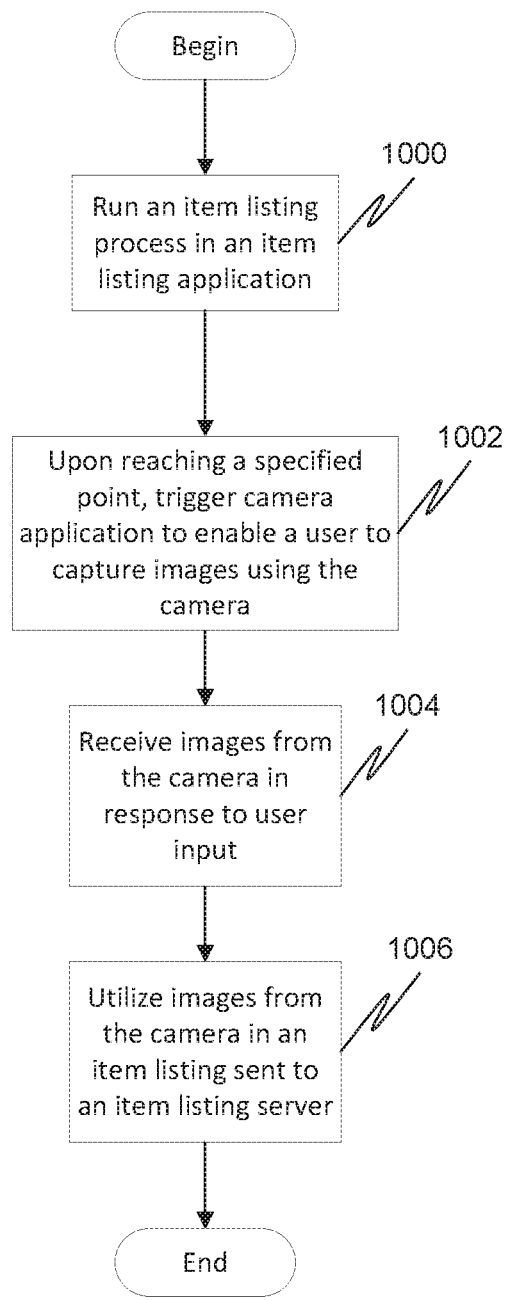
FIG. 10 is a flow diagram illustrating a method for guiding the capture of information from a camera on a user device in accordance with an example embodiment.

FIG. 10 is a flow diagram illustrating a method for guiding the capture of information from a camera on a user device in accordance with an example embodiment. At 1000, an item listing process is run in an item listing application. At 1002, upon reaching a specified point in the item listing process, a camera application is triggered to enable a user to capture images using the camera. The triggering includes providing a wireframe overlay informing the user as to an angle at which to capture images from the camera. At 1004, images are received from the camera in response to user input, such as the depressing of a virtual or physical button. At 1006, the images from the camera are utilized in an item listing sent to an item listing server.

Figure 11:
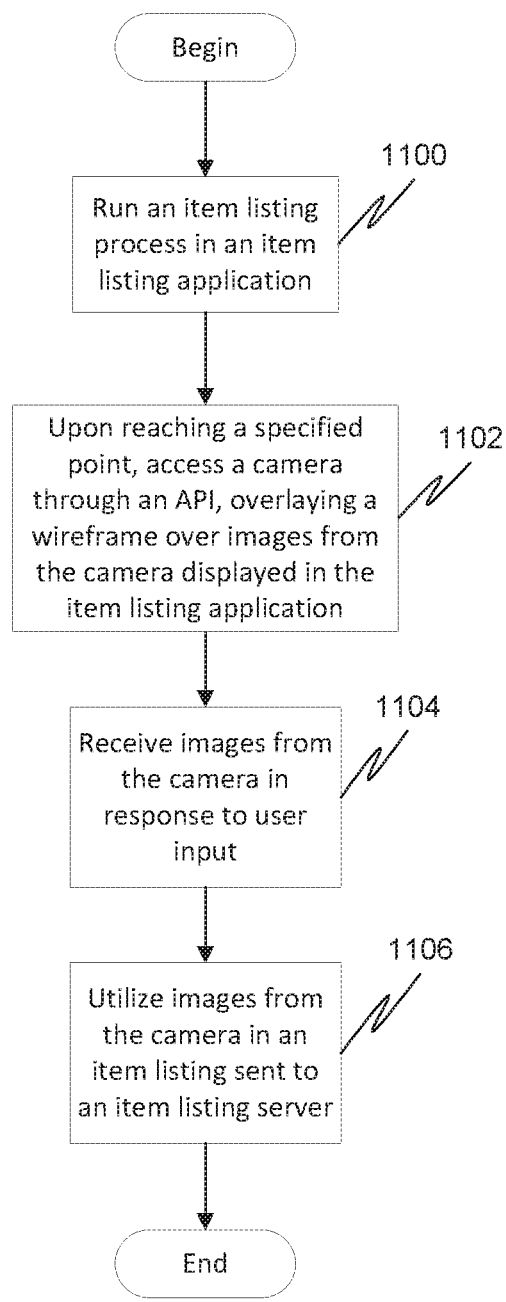
FIG. 11 is a flow diagram illustrating a method for guiding the capture of information from a camera on a user device in accordance with another example embodiment.

FIG. 11 is a flow diagram illustrating a method for guiding the capture of information from a camera on a user device in accordance with another example embodiment. In this example embodiment, no separate camera application is used, but rather the camera is directly accessed via an API by the item listing application. At 1100, an item listing process is run in an item listing application. At 1102, upon reaching a specified point in the item listing process, a camera is accessed through an API, overlaying a wireframe over images from the camera displayed in the item listing application to inform the user as to an angle at which to capture images from the camera. At 1104, images are received from the camera in response to user input, such as the depressing of a virtual or physical button. At 1106, the images from the camera are utilized in an item listing sent to an item listing server.

Figure 12:
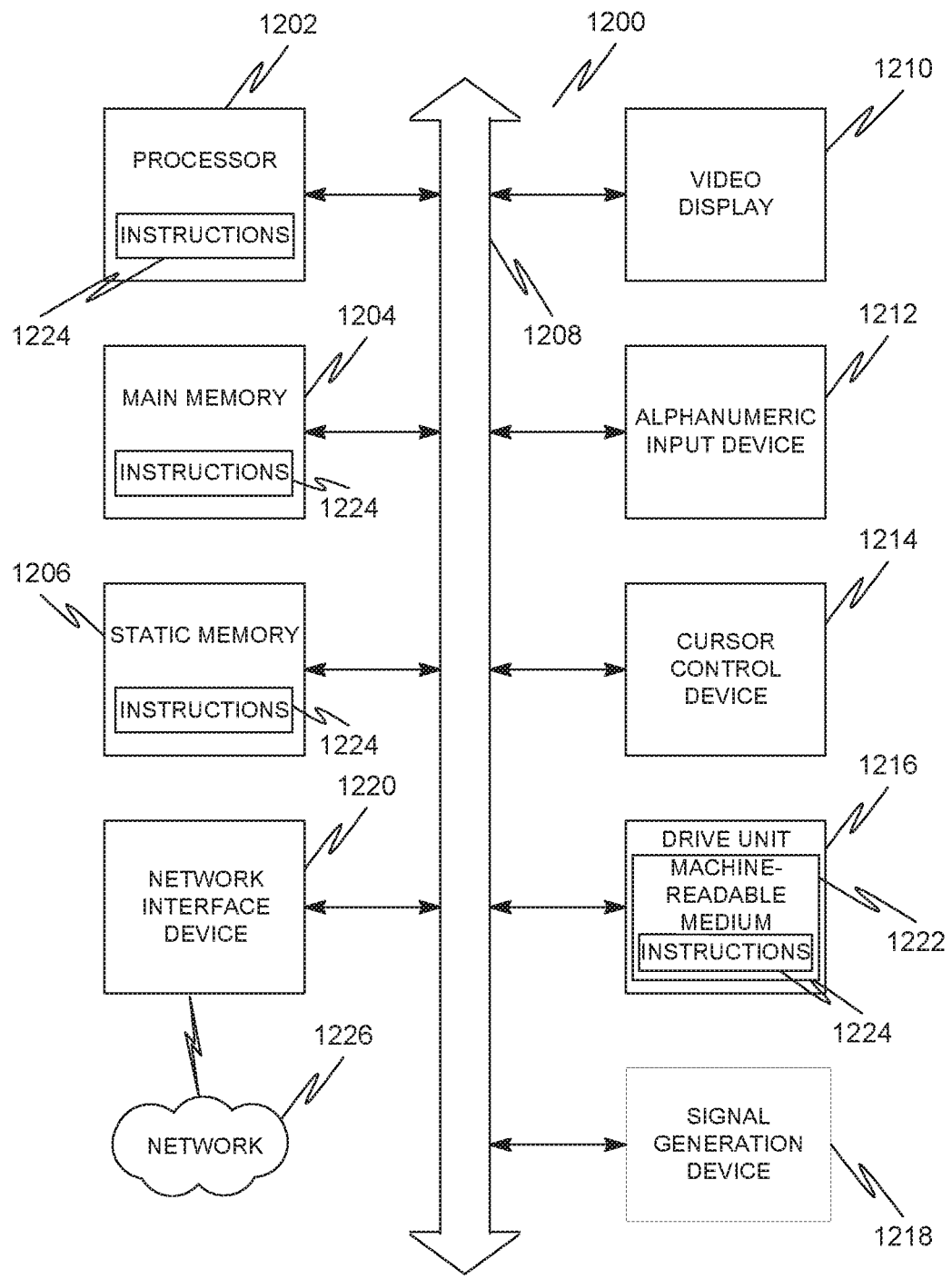
FIG. 12 shows a diagrammatic representation of machine in the example form of a computer system 1200 within which a set of instructions, for causing the machine to perform any one or more of the methodologies discussed herein, may be executed.

FIG. 12 shows a diagrammatic representation of machine in the example form of a computer system 1200 within which a set of instructions, for causing the machine to perform any one or more of the methodologies discussed herein, may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a server computer, a client computer, a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1200 includes a processor 1202 (e.g., a central processing unit (CPU) a graphics processing unit (GPU) or both), a main memory 1204 and a static memory 1206, which communicate with each other via a bus 1208. The computer system 1200 may further include a video display unit 1210 (e.g., a liquid crystal display (LCD) or a cathode ray tube (CRT)). The computer system 1200 also includes an alphanumeric input device 1212 (e.g., a keyboard), a cursor control device 1214 (e.g., a mouse), a disk drive unit 1216, a signal generation device 1218 (e.g., a speaker) and a network interface device 1220.

The disk drive unit 1216 includes a machine-readable medium 1222 on which is stored one or more sets of instructions (e.g., software 1224) embodying any one or more of the methodologies or functions described herein. The software 1224 may also reside, completely or at least partially, within the main memory 1204 and/or within the processor 1202 during execution thereof by the computer system 1200, the main memory 1204 and the processor 1202 also constituting machine-readable media.

The software 1224 may further be transmitted or received over a network 1226 via the network interface device 1220.

While the machine-readable medium 1222 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present invention. The term "machine-readable medium" shall accordingly be taken to include, but not be limited to, solid-state memories, optical and magnetic media, and carrier wave signals.

Although the present invention has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense.

The Abstract of the Disclosure is provided to comply with 107 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

The invention claimed is:

1. A method comprising:
   displaying image data captured by a computing device on a display of the computing device;
   displaying an overlay and instructions for aligning an item depicted in the image data with the overlay on the display of the computing device;
   determining that the item depicted in the image data is not properly positioned in relation to the overlay;
   displaying additional instructions on the display of the computing device for aligning the item depicted in the image data with the overlay in response to determining that the item depicted in the image data is not properly positioned in relation to the overlay; and
   capturing an image of the item while the item is aligned with the overlay displayed on the display of the computing device.

2. The method of claim 1, wherein the image data comprises a video and capturing the image of the item while the item is aligned with the overlay displayed on the display of the computing device comprises extracting the image of the item from the video.

3. The method of claim 1, wherein the overlay comprises a wireframe.

4. The method of claim 1, wherein the instructions and additional instructions are text instructions displayed on the display of the computing device.

5. The method of claim 1, wherein determining that the item depicted in the image data is not properly positioned in relation to the overlay comprises determining that the item is depicted at a position in the image data other than a position of the overlay, wherein the additional instructions specify a direction for moving one of the computing device or the item to properly position the item in relation to the overlay.

6. The method of claim 1, wherein the additional instructions indicate that the computing device should be rotated to properly position the item in relation to the overlay.

7. The method of claim 1, wherein determining that the item depicted in the image data is not properly positioned in relation to the overlay comprises determining that a minimum lighting standard has not been achieved.

8. The method of claim 1, wherein determining that the item depicted in the image data is not properly positioned in relation to the overlay comprises determining that appropriate sharpness has not been achieved.

9. The method of claim 1, wherein the instructions for aligning the item depicted in the image data with the overlay on the display of the computing device include instructions to ensure proper lighting.

10. The method of claim 1, wherein the instructions for aligning the item depicted in the image data with the overlay on the display of the computing device include instructions to ensure proper sharpness.

11. A system comprising:
    at least one processor; and
    a memory coupled to the at least one processor and storing instructions that, when executed by the at least one processor, cause the at least one processor to perform operations comprising:
       displaying image data captured by a computing device on a display of the computing device;
       displaying an overlay and instructions for aligning an item depicted in the image data with the overlay on the display of the computing device;
       determining that the item depicted in the image data is not properly positioned in relation to the overlay;
       displaying additional instructions on the display of the computing device for aligning the item depicted in the image data with the overlay in response to determining that the item depicted in the image data is not properly positioned in relation to the overlay; and
       causing the computing device to capture an image of the item while the item is aligned with the overlay displayed on the display of the computing device.

12. The system of claim 11, wherein the image data comprises a video and capturing the image of the item while the item is aligned with the overlay displayed on the display of the computing device comprises extracting the image of the item from the video.

13. The system of claim 11, wherein the overlay comprises a wireframe.

14. The system of claim 11, wherein the instructions and the additional instructions are text instructions displayed on the display of the computing device.

15. The system of claim 11, wherein determining that the item depicted in the image data is not properly positioned in relation to the overlay comprises determining that the item is depicted at a position in the image data other than a position of the overlay, wherein the additional instructions specify a direction for moving one of the computing device or the item to properly position the item in relation to the overlay.

16. The system of claim 11, wherein the additional instructions indicate that the computing device should be rotated to properly position the item in relation to the overlay.

17. The system of claim 11, wherein determining that the item depicted in the image data is not properly positioned in relation to the overlay comprises determining that a minimum lighting standard has not been achieved.

18. The system of claim 11, wherein determining that the item depicted in the image data is not properly positioned in relation to the overlay comprises determining that appropriate sharpness has not been achieved.

19. The system of claim 11, wherein the instructions for aligning the item depicted in the image data with the overlay on the display of the computing device include instructions to ensure proper lighting and instructions to ensure proper sharpness.

20. A mobile computing device comprising:
a display;
a camera;
at least one processor; and
a memory coupled to the at least one processor and storing instructions that, when executed by the at least one processor, cause the at least one processor to perform operations comprising:
  displaying image data captured by the camera on the display;
  displaying an overlay and instructions for aligning an item depicted in the image data with the overlay on the display;
  determining that the item depicted in the image data is not properly positioned in relation to the overlay;
  displaying additional instructions on the display for aligning the item depicted in the image data with the overlay in response to determining that the item depicted in the image data is not properly positioned in relation to the overlay; and
  causing the camera to capture an image of the item while the item is aligned with the overlay displayed on the display.

\* \* \* \* \*